US010454012B2

United States Patent
Nishide et al.

(10) Patent No.: US 10,454,012 B2
(45) Date of Patent: *Oct. 22, 2019

(54) THERMOELECTRIC CONVERSION MODULE

(75) Inventors: Akinori Nishide, Tokyo (JP); Yosuke Kurosaki, Tokyo (JP); Jun Hayakawa, Tokyo (JP); Shin Yabuuchi, Tokyo (JP); Hiroyuki Yamamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/402,828

(22) PCT Filed: May 22, 2012

(86) PCT No.: PCT/JP2012/063044
§ 371 (c)(1),
(2), (4) Date: Jan. 26, 2015

(87) PCT Pub. No.: WO2013/175571
PCT Pub. Date: Nov. 28, 2013

(65) Prior Publication Data
US 2015/0179909 A1     Jun. 25, 2015

(51) Int. Cl.
*H01L 35/20* (2006.01)
*H01L 35/14* (2006.01)
*H01L 35/12* (2006.01)
*H01L 35/32* (2006.01)
*H01L 35/28* (2006.01)

(52) U.S. Cl.
CPC .............. *H01L 35/20* (2013.01); *H01L 35/12* (2013.01); *H01L 35/14* (2013.01); *H01L 35/28* (2013.01); *H01L 35/32* (2013.01)

(58) Field of Classification Search
CPC ......... H01L 36/14; H01L 36/20; H01L 35/14; H01L 35/20
USPC .................................................... 136/200–242
See application file for complete search history.

(56) References Cited

U.S. PATENT DOCUMENTS 7,849,909 B2 * 12/2010 Nakajima ............. B22F 1/0055
                                                        164/122
2002/0024154 A1 * 2/2002 Hara ...................... H01L 23/38
                                                        257/712

(Continued)

FOREIGN PATENT DOCUMENTS

JP        2004-119647    *  4/2004
WO        03/019681 A1       3/2003

OTHER PUBLICATIONS

Machine translation of JP 2004-119647; accessed and printed Feb. 7, 2016.*

(Continued)

*Primary Examiner* — Edward J. Schmiedel
(74) *Attorney, Agent, or Firm* — Mattingly & Malur, PC (57) ABSTRACT

The present invention aims at providing a thermoelectric conversion module with low toxicity, which exhibits conversion efficiency equivalent to that of BiTe.
The thermoelectric conversion module of the present invention employs a full Heusler alloy as the material for forming the P-type thermoelectric conversion unit and the N-type thermoelectric conversion unit. The material for forming the N-type thermoelectric conversion unit contains at least any one of Fe, Ti, and Si and Sn.

8 Claims, 6 Drawing Sheets

(56) References Cited

U.S. PATENT DOCUMENTS

| | | | | |
|---|---|---|---|---|
| 2004/0231714 | A1* | 11/2004 | Stark | H01L 35/16 |
| | | | | 136/211 |
| 2007/0034245 | A1* | 2/2007 | Nakajima | C22C 12/00 |
| | | | | 136/205 |
| 2008/0092940 | A1* | 4/2008 | Nakajima | B22F 1/0055 |
| | | | | 136/206 |
| 2008/0135082 | A1* | 6/2008 | Hirono | H01L 35/08 |
| | | | | 136/239 |
| 2013/0014798 | A1* | 1/2013 | Nishide | H01L 35/20 |
| | | | | 136/205 |
| 2014/0102500 | A1* | 4/2014 | Fujiwara | H01L 35/08 |
| | | | | 136/205 |
| 2014/0209142 | A1* | 7/2014 | Hayakawa | H01L 37/00 |
| | | | | 136/205 |
| 2014/0345663 | A1* | 11/2014 | Hayakawa | H01L 35/14 |
| | | | | 136/205 |

OTHER PUBLICATIONS

Graf, T. et al., "Heusler Compounds—A Material Class with Exceptional Properties", IEEE Transactions on Magnetics, Feb. 2011 pp. 367-373, vol. 47, No. 2.

* cited by examiner

THERMOELECTRIC CONVERSION MODULE

TECHNICAL FIELD

The present invention relates to a thermoelectric conversion module, a thermoelectric conversion material, and a method of manufacturing the thermoelectric conversion module.

BACKGROUND ART

Recent growing international interest in reduction of $CO_2$ emission regarded as causative agent of global warming has given a boost to technological innovation for transition from the energy resource that emits a large quantity of $CO_2$ to the next generation energy realized by reusing natural energy and thermal energy. Possible candidates for realizing the next generation energy technology include the one by the use of natural energy such as sunlight and wind power, and the one of reusing the loss of the primary energy such as heat and vibration, resulting from the resource energy emission.

The conventional resource energy has been of concentrated type mainly generated by the large-scale power generation facility. On the contrary, the next generation energy including both natural energy and reusable energy takes unevenly distributed form. In the recent energy utilization, the energy is emitted in the form of exhaust heat without being used, which accounts for approximately 60% of the primary energy. Accordingly, it has been demanded to increase the rate of the next generation energy to the primary energy, and simultaneously, to improve the energy reuse technology, especially, the technology for converting the exhaust heat energy into power.

Considering utilization of the exhaust heat energy which occurs in every possible circumstance, the highly versatile power generation system from the aspect of installation is necessary. The thermoelectric conversion module is one of the strong candidate technologies for the aforementioned system.

The thermoelectric conversion module is a backbone of the thermoelectric conversion technology. The thermoelectric conversion module installed adjacent to the heat source generates power by the temperature difference which occurs in the module. The thermoelectric conversion module is configured to alternately arrange n-type thermoelectric conversion material for generating electromotive force directed from the high-temperature side to the low-temperature side with respect to the temperature gradient, and p-type thermoelectric conversion material having the electromotive force directed opposite the n-type thermoelectric conversion material.

The maximum output P of the thermoelectric conversion module is determined by a product of a heat flow Q into the module and a conversion efficiency n of the thermoelectric conversion material. The heat flow Q depends on the module structure suitable for the thermoelectric conversion material. The conversion efficiency $\eta$ depends on the dimensionless variable ZT determined by Seebeck coefficient S, resistivity $\rho$, and the thermal conductivity $\kappa$ of the material. It is therefore necessary to improve the physical property of the thermoelectric conversion material in order to improve the conversion efficiency.

Various studies have been made concerning the thermoelectric conversion material for solving the aforementioned problem. The BiTe alloy is one of the thermoelectric conversion materials which have been put into practical use. The materials of both Bi and Te exhibit high conversion efficiency but are costly. As the Te exhibits significantly high toxicity, it is difficult to realize the mass production, cost reduction and environmental load reduction. The high efficiency thermoelectric conversion material which replaces the BiTe alloy has been demanded. The following Patent Literature 1 discloses the thermoelectric conversion material derived from the material that includes Heusler alloy type crystal structure.

CITATION LIST

Patent Literature

Patent Literature 1: PCT International Publication No. WO2003/019681

SUMMARY OF INVENTION

Technical Problem

It is an object of the present invention to provide a thermoelectric conversion module with low toxicity, which exhibits conversion efficiency comparable to the BiTe.

Solution to Problem

The thermoelectric conversion module according to the present invention employs a full Heusler alloy as the material for forming the P-type thermoelectric conversion unit and the N-type thermoelectric conversion unit. The material for forming the N-type thermoelectric conversion unit contains at least any one of Fe, Ti, and Si and Sn.

Advantageous Effects of Invention

The present invention ensures to provide the thermoelectric conversion module with high thermoelectric conversion efficiency while exhibiting low toxicity.

The problem, structure and effect of the present invention besides those described above will be apparent by explanation of the embodiments as described below.

DESCRIPTION OF EMBODIMENTS

First Embodiment

Module Structure

Figure 1A:
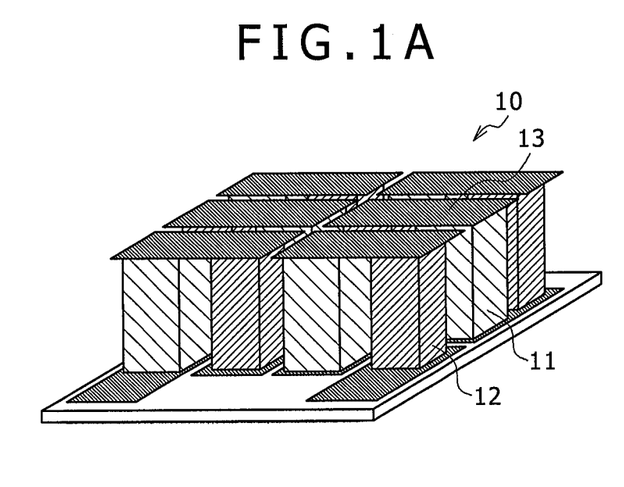
FIG. 1 is a schematic view of a thermoelectric conversion module 10 according to a first embodiment.
Figure 1B:
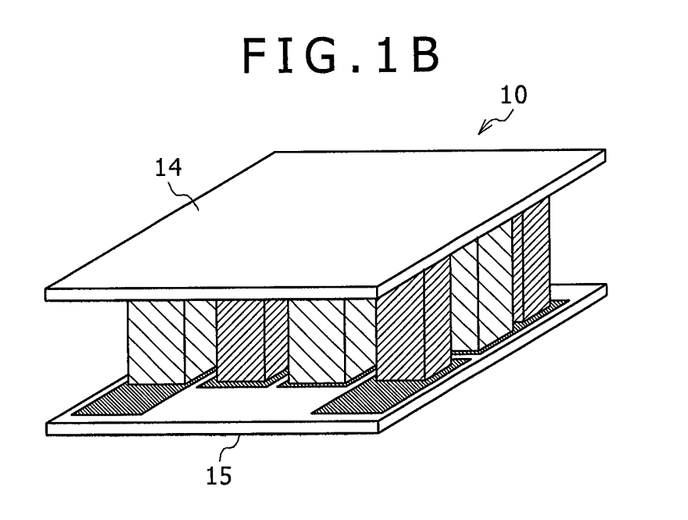

FIG. 1 is a schematic view of a thermoelectric conversion module 10 according to a first embodiment of the present invention. The thermoelectric conversion module 10 includes a P-type thermoelectric conversion unit 11 formed by using a P-type thermoelectric conversion material, an N-type thermoelectric conversion unit 12 formed by using an N-type thermoelectric conversion material, an electrode 13, and substrates 14, 15, which are assembled together. A not shown framework is provided to cover the assembly. Apart of the electrode 13 is drawn outside the framework so as to take electricity from the respective thermoelectric conversion units.

The P-type thermoelectric conversion unit 11 and the N-type thermoelectric conversion unit 12 are bonded and arranged so as to be alternately and electrically connected in series through the electrode 13. A group formed by connecting the P-type thermoelectric conversion units 11 and the N-type thermoelectric conversion units 12 in series will be called a PN element. The PN element is vertically interposed between the substrates 14 and 15 so that the PN element is mounted on the substrate. The structure is configured to transfer heat to the respective thermoelectric conversion units via the substrate 14 and 15. Each of the thermoelectric conversion units is electrically arranged in series, and thermally in parallel.

First Embodiment

Principle for Improvement of Conversion Performance

The principle for improving the conversion performance of the thermoelectric conversion material will be described. Various types of candidates for the material that replaces the BiTe alloy have been studied. A certain type of full Heusler alloy is one of the candidate materials for the low temperature region. The full Heusler alloy which exhibits the thermoelectric conversion performance represented by $Fe_2VAl$ has an electronic state so called pseudo gap. General relationship between the thermoelectric conversion performance and the electronic state will be described in order to clarify the correlation of the pseudo gap with the thermoelectric conversion performance.

The performance index of the thermoelectric conversion material is derived from the following Formula 1, taking the dimensionless number referred to as ZT as the index.

[Formula 1]

$$ZT = \frac{S^2}{\kappa \rho} T \qquad \text{Formula 1}$$

S: Seebeck coefficient, κ: thermal conductivity, ρ: resistivity, T=room temperature (300 K).

The larger the Seebeck coefficient S becomes, and the lower the resistivity and thermal conductivity become, the larger the performance index becomes. The Seebeck coefficient S and the resistivity ρ are physical quantity determined by the electronic state of the substance. The Seebeck coefficient S has a relationship as expressed by the following Formula 2.

[Formula 2]

$$S \propto \frac{1}{N(E_F)} \left( \frac{\partial N(E)}{\partial E} \right)_{E \sim E_F} \qquad \text{Formula 2}$$

E: binding energy, N: state density.

According to the Formula 2, the Seebeck coefficient S is inversely proportional to the absolute value of the density of states (DS) N at Fermi level, and proportional to the energy gradient. This clearly shows that the substance with low density of states at the Fermi level, which sharply changes rise-up of the density of states, is allowed to have high Seebeck coefficient S.

Meanwhile, the resistivity ρ has the correlation as expressed by the following Formula 3.

[Formula 3]

$$\frac{1}{\rho} \propto \lambda_F v_F N(E_F) \qquad \text{Formula 3}$$

$\lambda_F$: mean free path of electron at Fermi level, $v_F$: electron velocity at Fermi level According to the Formula 3, the resistivity ρ is inversely proportional to the density of states N. Therefore, the resistivity ρ becomes small when the Fermi level is at the energy position with large absolute value of the density of states N.

Resuming the explanation of the electronic state of the pseudo gap, the band structure of the pseudo gap is in the electronic state where the density of states around the Fermi level is markedly dropped. Typically, when the composition ratio of the compound is changed, the band structure of $Fe_2VAl$ based alloy takes a behavior like rigid band model to change only the energy position at the Fermi level without significantly changing the band structure. The $Fe_2VAl$ based alloy has electrons doped or hole-doped by changing the composition ratio or composition of the compound so that the Fermi level is controlled to the energy position at which the density of states sharply changes, and the absolute value of the density of states is optimized. This is thought to optimize the relationship between the Seebeck coefficient and the resistivity. Furthermore, the $Fe_2VAl$ based alloy is the matter system which can be realized into both p-type and n-type. Positive usage of the energy level that causes sharp change in the density of states by the $Fe_2VAl$ for realizing the thermoelectric conversion performance is expected to further improve the performance.

The thermal conductivity κ may be regarded as the sum of the lattice thermal conductivity κp for heat transfer through lattice vibration and the electron heat conductivity κe for heat transfer through the electron serving as a medium. It is said that the electron heat conductivity κe becomes high as the resistivity becomes lower in accordance with Wiedemann-Franz law, and depends on the pseudo gap electronic state. Meanwhile, the following Formula 4 clearly shows that the lattice thermal conductivity κp depends on the lattice size. To summarize, the thermal conductivity κ may be expressed as follows.

[Formula 4]

$$\kappa = k_f \times C_p \times \zeta \quad \text{Formula 4}$$

[Formula 5]

$$k_f = \frac{d^2}{\tau_f} \quad \text{Formula 5}$$

ζ material density, d: particle size, $C_p$: sample's specific heat at constant pressure, $\tau_f$: time taken for heat transfer from the back surface to the upper surface of the particle.

Formulae 4 and 5 clearly show that the thermal conductivity κ becomes small as the particle size of the sample is reduced. In this way, the full Heusler alloy remarkably improves the thermoelectric conversion performance by controlling the electronic state of the alloy to reduce the particle size of the sample.

As described above, in the present invention, the full Heusler alloy is employed as the thermoelectric conversion material. The $Fe_2VaI$ based alloy which exhibits the P-type characteristic is used as the material for forming the P-type thermoelectric conversion unit 11, and $Fe_2TiSiSn$ based alloy which exhibits the N-type characteristic is used as the material for forming the N-type thermoelectric conversion unit 12.

The pseudo gap structure that determines the thermoelectric conversion characteristic of the full Heusler alloy has a distinctive band structure called flat band. It is suggested that the flat band mainly determines the thermoelectric conversion material. It is thought that the thermoelectric conversion characteristic is improved by controlling the flat band into appropriate states.

Figure 2A:
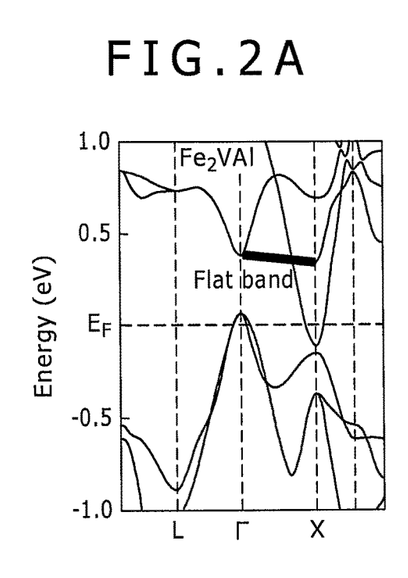
FIG. 2 is a view showing electronic states of the full Heusler alloy as results of the first-principle calculation.
Figure 2B:
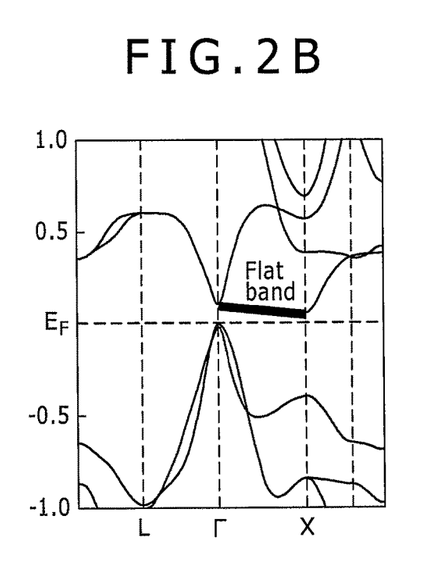

FIG. 2 represents the calculation results of the electronic state of the full Heusler alloy obtained through the first-principle calculation. FIG. 2(a) represents the electronic state of the $Fe_2VAl$, and FIG. 2(b) represents the electronic state of $Fe_2TiSiSn$ based alloy as the full Heusler alloy that has been newly developed in accordance with the present invention.

As FIG. 2 shows, the flat band is brought close to the area around the Fermi level by changing the alloy composition of the $Fe_2VAl$ so as to allow sharp change in the state density around the Fermi level. This may improve the thermoelectric conversion characteristic, especially, Seebeck coefficient.

In the case where at least any one of Nb, V, Mo, W and Zr is added as the additive material for adjusting the total amount of electrons, the characteristic similar to the one as shown in FIG. 2(b) is considered to be obtained. As Si and Sn belong to the same group specified by the periodic table, the characteristic similar to the one as shown in FIG. 2(b) is considered to be obtained even if the composition ratio of such element is changed.

According to the present invention, the alloy composition which can be practically formed and exhibit high performance thermoelectric conversion characteristic is selected from those suggested as a result of the first-principle calculation. Especially the $Fe_2TiSiSn$ based alloy has the flat band around the Fermi level as indicated by the view of the band shown in FIG. 2(b), resulting in significantly high thermoelectric conversion efficiency. The present invention is configured to employ $Fe_{2+\delta}Ti_xV_ySi_zSn_q$ as the N-type thermoelectric conversion material, which is intended to provide the thermoelectric conversion module with high conversion efficiency.

First Embodiment

Structure Example of Thermoelectric Conversion Module 10

An example of the structure of the thermoelectric conversion module 10 produced in accordance with the aforementioned principle will be described. This example uses $Fe_2VAl$ alloy as the material for forming the P-type thermoelectric conversion unit 11, and $Fe_2TiSiSn$ based alloy as the material for forming the N-type thermoelectric conversion unit 12. It is configured to use Ta as the material for forming the electrode 13, and AlN for forming the substrates 14 and 15. The material with high heat conductivity and high strength may be used for forming the framework. The steel is used in this example.

Figure 3A:
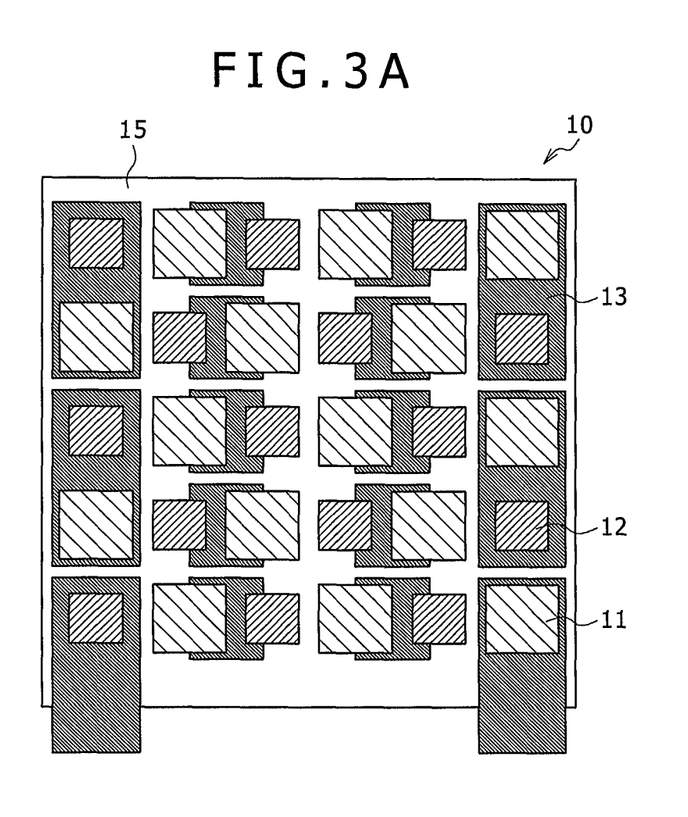
FIG. 3 is a top view of the thermoelectric conversion module 10.
Figure 3B:
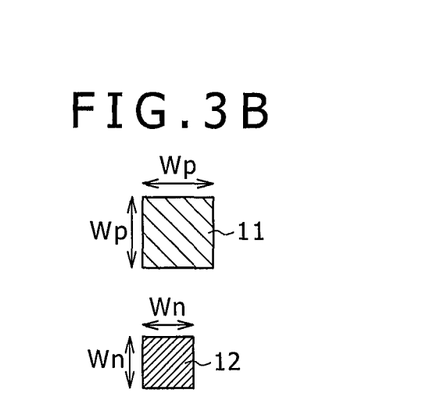

FIG. 3 is a top view of the thermoelectric conversion module 10. FIG. 3(a) is a view of the substrate on which the respective thermoelectric conversion units are mounted, which is seen from above in the normal direction. FIG. 3(b) represents definition of each dimension of the respective thermoelectric conversion units. The cross-section sizes of the P-type thermoelectric conversion unit 11 both in vertical and horizontal directions are defined as Wp, and the cross-section sizes of the N-type thermoelectric conversion unit 12 both in vertical and horizontal directions are defined as Wn. The height of the PN element (length of the substrate in the normal direction) is defined as L. Those sizes may be set to L=6 mm, Wp=10 mmm, Wn=3 mm, for example.

The respective thermoelectric conversion units may be produced through the sintering method with a hot press. The powder element as the material is filled in the carbon die for sintering while adjusting the weight so that the alloy element composition ratio becomes as designed.

The $Fe_2TiVSi$ based alloy is produced by weighing the powder of the elements including Fe, Ti, V and Si to be filled in the carbon die so that the element composition ratio corresponds to the compositional formula as described above, for example, Fe:Ti:V:Si=2.1:0.8:0.2:1.2 (δ=0.1, x=0.8, y=0.2, z=1.2, q=0). It is subjected to reaction sintering at the temperature of 800° C. for 5000 seconds, for example. In order to improve the degree of order of the crystal structure of the sintered body resulting from the reaction sintering, the heating process may be applied, for example, at 600° C. for two days. The additive material V is mixed with the composition in order to improve the performance of the thermoelectric conversion material and to stabilize the crystal structure. The thus produced pellet is processed to have the aforementioned dimensions so as to be mounted on the thermoelectric conversion module 10.

In the structure example, $Fe_2VAl$ is used as the material for forming the P-type thermoelectric conversion unit 11, which is not limited thereto. For example, it is possible to use $Fe_2NbAl$, $FeS_2$ and the like. It is possible to use GaN as the material for forming the substrates 14 and 15, and use Cu or Au as the material for forming the electrode 13.

In the structure example, the material composition of the N-type thermoelectric conversion unit is set to $Fe_{2.1}Ti_{0.8}V_{0.2}Si_{1.2}$, which is not limited thereto. It is possible to use the alloy composition with characteristic as the full Heusler alloy that exhibits the N-type characteristic as shown in FIG. 2(b). In consideration of the range reported as providing the similar characteristic irrespective of varied composition ratio of Fe in the field of related art, the similar characteristic to the one shown in FIG. 2 (b) is considered to be obtained so long as the relationship of approximately $-0.1 \leq \delta \leq 0.2$ is established.

In the case where at least any one of Nb, V, Mo, W and Z is added as the additive material, it is considered necessary to make the total of the composition ratios of those additive materials smaller than the composition ratio of Ti. If the total composition ratio of the additive materials becomes larger, it will deviate from the range of the $Fe_2TiSiSn$ based alloy as described in FIG. 2(b).

First Embodiment

Summary

The thermoelectric conversion module 10 according to the first embodiment uses the full Heusler alloy as the material for forming both the P-type thermoelectric conversion unit 11 and the N-type thermoelectric conversion unit 12. The material for forming the N-type thermoelectric conversion unit 12 is the $Fe_2TiSiSn$ based full Heusler alloy which contains at least any one of Fe, Ti, and Si and Sn. This makes it possible to provide the thermoelectric conversion module with high thermoelectric conversion efficiency and low toxicity.

Second Embodiment

The thermoelectric conversion performance of the thermoelectric conversion module is likely to be influenced by the heat flow Q into the module in addition to the conversion efficiency η of the thermoelectric conversion material. The heat flow Q is a variable influenced by the structure (especially each size of the components) of the thermoelectric conversion module. It is therefore important to design the module structure suitable for the characteristic of the selected thermoelectric conversion material. In the second embodiment of the present invention, optimization of each size of the respective components of the thermoelectric conversion module 10 will be examined on the assumption that the thermoelectric conversion material as described in the first embodiment is employed. The other structure of the thermoelectric module 10 is similar to the one as described in the first embodiment.

Figure 4:
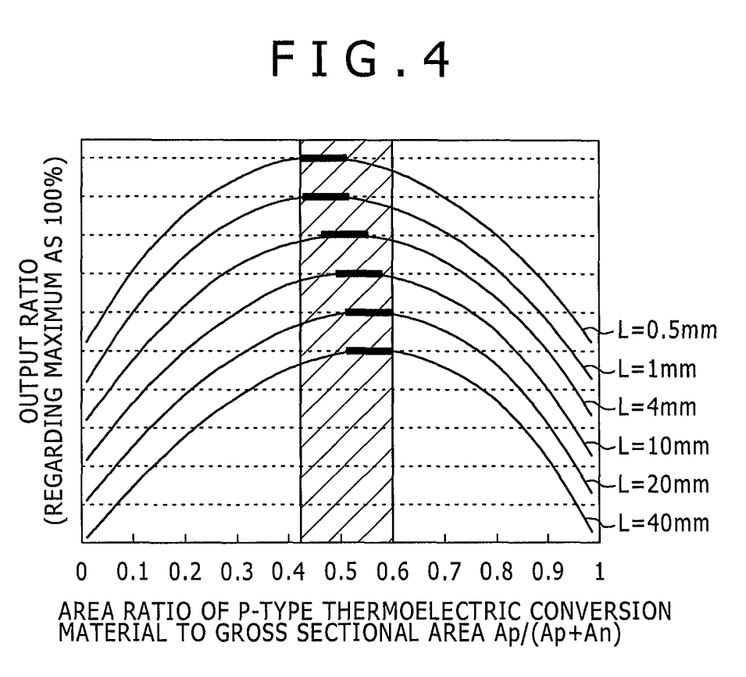
FIG. 4 is a graph representing results of calculating output change resulting from variously changing the ratio of the cross-section area between the P-type thermoelectric conversion unit 11 and the N-type thermoelectric conversion unit 12.

FIG. 4 is a graph showing calculation results of output change resulting from variously changing the ratio of the cross-section area between the P-type thermoelectric conversion unit 11 and the N-type thermoelectric conversion unit 12. The material for forming the respective thermoelectric conversion units as described in the structure example of the first embodiment is employed, using the thermoelectric conversion efficiency η of the material. On the aforementioned assumption, calculation is carried out to obtain the temperature difference which occurs in the thermoelectric conversion module 10 when the high temperature heat source is 90° C., and the low temperature heat source is 20° C., and the output caused by the temperature difference. The temperature of the high temperature heat source of 90° C. is assumed as the one at which the exhaust heat from the plant, power station and the like is fed with water. The aforementioned parameters are the same as those shown in the drawings as described below.

The x-axis of FIG. 4 denotes a ratio of a cross-section area Ap of the P-type thermoelectric conversion unit 11 to the sum of the Ap and a cross-section area An of the N-type thermoelectric conversion unit 12, that is, (Ap+An). The y-axis of FIG. 4 denotes a power output of the single PN element. As the output characteristics of the PN element vary with the value of L, the same calculation is carried out using a plurality of values L. The calculation results with respect to the same values L are normalized by setting the maximum output upon employment of the value L to 100%. Each of the respective thermoelectric conversion units is not necessarily required to have a square shape, but may have a rectangular shape, an elliptical shape and the like so long as the similar characteristics to those shown in FIG. 4 are obtained.

As FIG. 4 shows, the output of the PN element has the maximum value with respect to Ap/(Ap+An). It has been clarified that irrespective of the value L, the output approximate to the substantially maximum value may be obtained so long as the relationship of 0.42 Ap/(Ap+An)≤=0.6 is established.

Figure 5:
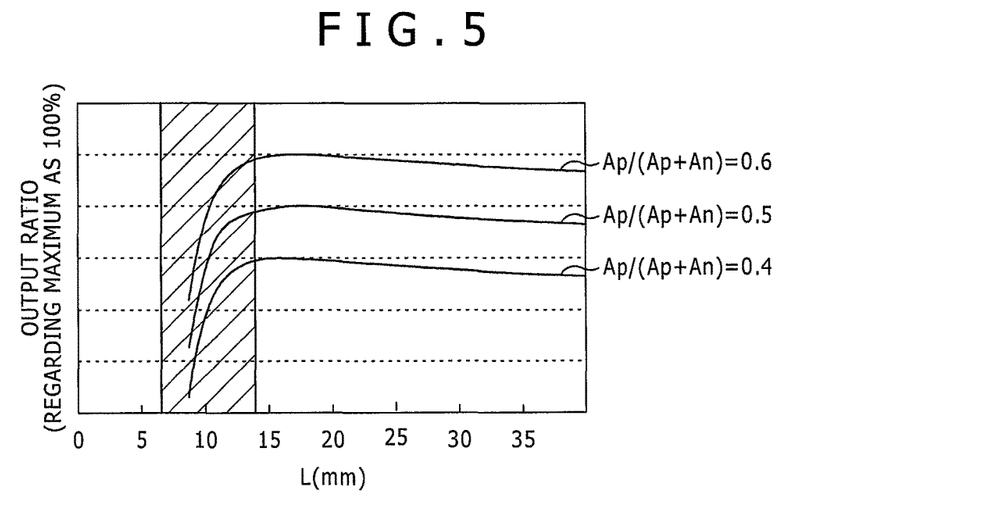
FIG. 5 is a graph representing results of calculating output change resulting from variously changing the value of L.

FIG. 5 is a graph showing calculation results of output change resulting from variously changing the value L. The x-axis of the graph of FIG. 5 denotes the L, and y-axis of FIG. 5 denotes the power output from the single PN element through normalization by setting the output value upon acquisition of the maximum output of the single PN element to 100%. As the output characteristics of the PN element vary with the value of Ap/(Ap+An) as shown in FIG. 4, the same calculation is executed using a plurality of same values. The calculation results with respect to the same Ap/(Ap+An) are normalized by setting the maximum output upon employment of the Ap (Ap+An) to 100%.

As FIG. 5 shows, the output does not become necessarily large as the value L becomes small, that is, the distance between the substrates 14 and 15 is reduced. It is clarified that there exists the value L optimum for the ratio between Ap and An. Any of the calculation results shows that once the value L is equal to or larger than a certain value, the output of the PN element tends to be lowered as it is further increased. It is considered to be caused by quantity of heat which is not concentrated on the PN element but discharged via the other part as the L becomes larger. According to the calculation results shown in FIG. 5, the output approximate to the substantially maximum value may be obtained so long as the relationship of 6 mm L 14.5 mm is established irrespective of any value of the Ap/(Ap+An).

Figure 6:
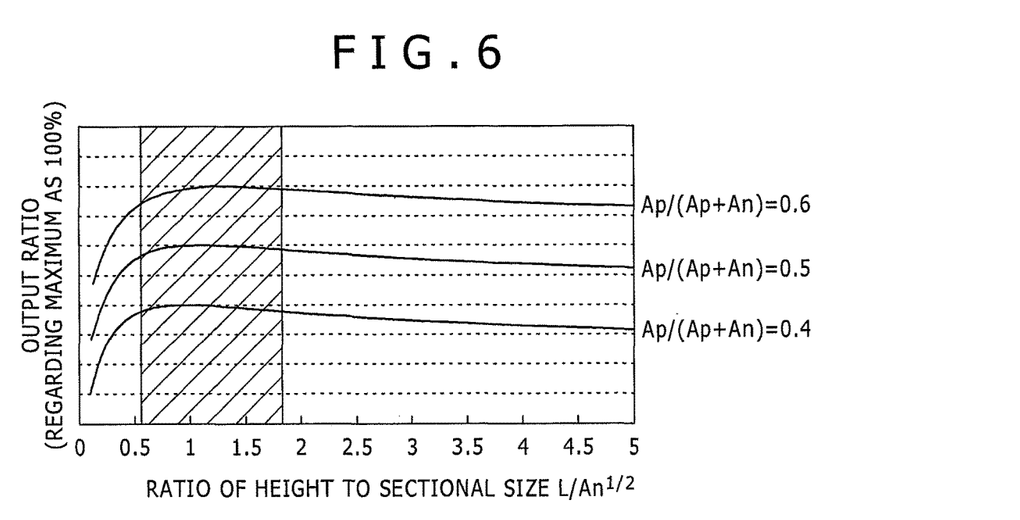
FIG. 6 is a graph representing results of calculating output change resulting from variously changing the ratio of the L and cross-section area of the N-type thermoelectric conversion unit 12.

FIG. 6 is a graph representing calculation results of the output change resulting from variously changing the ratio between L and the cross-section area of the N-type thermoelectric conversion unit 12. As FIG. 5 shows, the output of the PN element is influenced by the value L. It is considered that the output changes as the cross-section area of the PN element varies even if the L is kept to take the same value. Then the ratio between L and An is variously changed to calculate the output characteristics of the PN element.

The x-axis of FIG. 6 denotes the ratio of the square root $An^{1/2}$ of the cross-section area of the N-type thermoelectric conversion unit 12 to the L. The y-axis of FIG. 6 denotes the power output from the single PN element derived from normalization by setting the output value upon acquisition of the maximum output from the single PN element to 100%. As the output characteristics of the PN element vary with the value of Ap/(Ap+An) as shown in FIG. 4, the same calculation is carried out using the same values. The calculation results of the same Ap/(Ap+An) are normalized by setting the maximum output upon employment of the Ap/(Ap+An) to 100%.

FIG. 6 clarifies that there exists the value $L/An^{1/2}$ optimum for the ratio between Ap and An. Any of the calculation results shows the tendency that the output of the PN element gradually decreases as the value L relative to the $An^{1/2}$ becomes equal to or larger than a certain value. The reason of the aforementioned tendency is considered to be the same as the one described referring to FIG. 5. The calculation results shown in FIG. 6 show that the output approximate to substantially the maximum value may be obtained so long as the relationship of 0.6 mm≤$L/An^{1/2}$≤1.8 mm is established irrespective of any value of the Ap/(Ap+An).

FIG. 6 graphically represents the output change which occurs by changing the $L/An^{1/2}$ while keeping the AP/(Ap+An) constant, that is, (pattern a): L is increased/decreased while keeping Ap and An constant, or (pattern b): Ap and An are integrally increased/decreased while keeping the L constant.

The (pattern a) may be read that the maximum output is obtained in accordance with the value L. This clarifies that substantially the same results as those shown in FIG. 5 may be obtained.

The (pattern b) may be read that, assuming that the L takes the same value, the output of the PN element is increased to reach the maximum value as the value of $L/An^{1/2}$ changes from small side to large side, that is, the Ap and An change from large side to small side, and thereafter, the output of the PN element decreases as the value of $L/An^{1/2}$ becomes large, that is, the Ap and An become integrally small.

Figure 7:
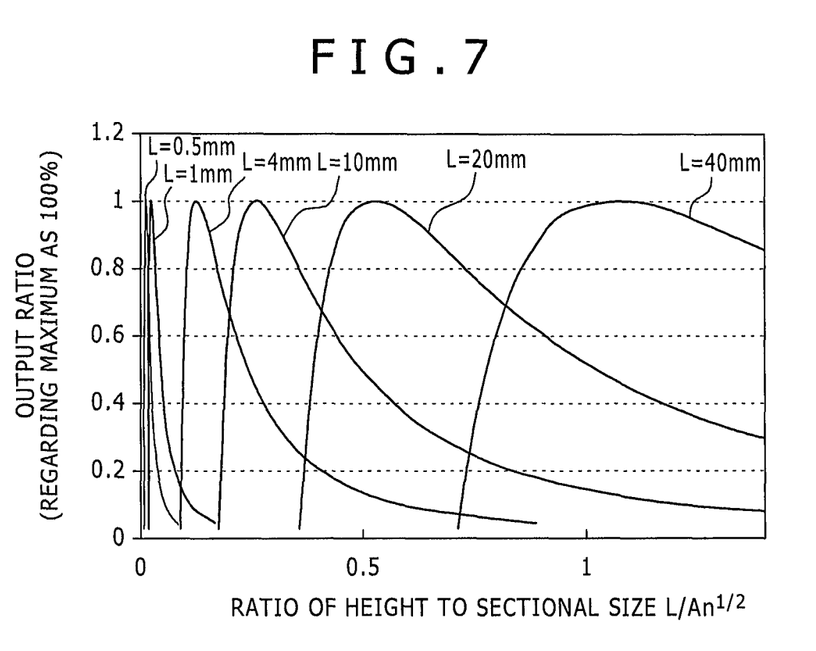
FIG. 7 is a graph representing results of calculating output change resulting from variously changing the ratio of the L and cross-section area of the N-type thermoelectric conversion units 12.

FIG. 7 is a graph representing calculation results of the output change resulting from variously changing the ratio between the value L and the cross-section area of the N-type thermoelectric conversion unit 12. The x-axis of FIG. 7 denotes the ratio of the square root of $An^{1/2}$ of the cross-section area of the N-type thermoelectric conversion unit 12 to L. The y-axis of FIG. 7 denotes the power output of the single PN element through normalization by setting the output value upon acquisition of the maximum output of the single PN element to 100%. As output characteristics of the PN element vary with the L value as shown in FIG. 5, the same calculation is executed using the same values. Each of the calculation results of the same L is normalized by setting the maximum output upon employment of the L to 100%.

FIG. 7 clarifies that, in the case where the L takes the same value, the output of the PN element is increased to reach the maximum value when the $L/An^{1/2}$ varies from the small side to large side, that is, the value $An^{1/2}$ varies from the large side to small side. Thereafter, the output of the PN element decreases as the $L/An^{1/2}$ becomes larger, that is, the value $An^{1/2}$ becomes smaller. This tendency corresponds to that of the (pattern b) as described referring to FIG. 6. It is to be noted that the assumption of keeping the AP/(Ap+An) constant is not set in the case as shown in FIG. 7.

The aforementioned tendency is not changed irrespective of the value L. However, the optimum values of $L/An^{1/2}$ vary in accordance with the value L. The value $L/An^{1/2}$ that provides the output approximate to the maximum value cannot be found from the L that takes any value.

Results shown in FIG. 7 clarifies that the range of $L/An^{1/2}$ capable of providing the large output is narrow when the value L is small, and the value $L/An^{1/2}$ is small, that is, An is large. In other words, when the value L is small, the An is required to be increased to be relatively larger than the value L for obtaining the large output. Meanwhile, when the value L is large, the range of the $L/An^{1/2}$ that provides the large output is wide, and the value $L/An^{1/2}$ is large, that is, the An is small. In other words, the greater freedom degree of designing the An may be obtained when the value L is large to a certain degree.

Referring to FIGS. 6 and 7, on the assumption that the value Ap/(Ap+An) is kept constant, the value $L/An^{1/2}$ may be in the range of 0.6 mm≤$L/An^{1/2}$≤1.8 mm. In view of design margin of the Ap and An, it is preferable to set the value L as large as possible.

Second Embodiment

Summary

On the assumption that the thermoelectric conversion material described in the first embodiment is employed, the optimum dimension of the thermoelectric conversion module 10 is examined based on various calculation results in the second embodiment. This makes it possible to find the optimum values for sizes of the respective components. Employment of the thermoelectric conversion material described in the first embodiment and the module structure described in the second embodiment ensures to optimize efficiency of the thermoelectric conversion module 10.

LIST OF REFERENCE SIGNS

10: thermoelectric conversion module, 11: P-type thermoelectric conversion unit, 12: N-type thermoelectric conversion unit, 13: electrode, 14 and 15: substrate

The invention claimed is:

1. A thermoelectric conversion module comprising:
a P-type thermoelectric conversion unit and an N-type thermoelectric conversion unit; and
a substrate on which the P-type thermoelectric conversion unit and the N-type thermoelectric conversion unit are mounted,
wherein a full Heusler alloy is used as a material for forming the P-type thermoelectric conversion unit and the N-type thermoelectric conversion unit,
wherein the full Heusler alloy forming the N-type thermoelectric conversion unit consists of Fe, Ti, at least one of Si or Sn, and an additive material of at least one of Nb, V, Mo, W, or Zr,
wherein an amount of the additive material is smaller than an amount of Ti in the full Heusler alloy forming the n-type thermoelectric conversion unit,
wherein the full Heusler alloy forming the P-type thermoelectric conversion unit is different from the full Heusler alloy forming the N-type thermoelectric conversion unit,
wherein a ratio of a cross-section area of the P-type thermoelectric conversion unit on a plane orthogonal to a normal direction of the substrate to a sum total of the cross-section area of the P-type thermoelectric conversion unit on the plane and a cross-section area of the N-type thermoelectric conversion unit on the plane is in a range from 0.42 to less than 0.5,
wherein the cross-section area of the N-type thermoelectric conversion unit is larger than the cross-section area of the P-type thermoelectric conversion unit, and
wherein a length of the P-type thermoelectric conversion unit in the normal direction of the substrate and a length of the N-type thermoelectric conversion unit in the normal direction are in a range from 6 mm to 14.5 mm.

2. The thermoelectric conversion module according to claim 1,
wherein a ratio of the length of the P-type thermoelectric conversion unit in the normal direction of the substrate to a square root of the cross-section area of the N-type thermoelectric conversion unit on the plane or a ratio of the length of the N-type thermoelectric conversion unit in the normal direction to the square root of the cross-section area of the N-type thermoelectric conversion unit on the plane is in a range from 0.6 to 1.8.

3. The thermoelectric conversion module according to claim 1,
wherein the P-type thermoelectric conversion unit and the N-type thermoelectric conversion unit are electrically connected in series via an electrode.

4. The thermoelectric conversion module according to claim 3, wherein Cu, Au or Ta is used as a material for forming the electrode.

5. The thermoelectric conversion module according to claim 3, wherein the full Heusler alloy forming the P-type thermoelectric conversion unit contains Fe, V, and Al.

6. A thermoelectric conversion module comprising:
a P-type thermoelectric conversion unit and an N-type thermoelectric conversion unit; and
a substrate on which the P-type thermoelectric conversion unit and the N-type thermoelectric conversion unit are mounted,
wherein a full Heusler alloy is used as a material for forming the P-type thermoelectric conversion unit and the N-type thermoelectric conversion unit,
wherein the full Heusler alloy forming the P-type thermoelectric conversion unit contains Fe, V, and Al,
wherein the full Heusler alloy forming the N-type thermoelectric conversion unit consists of Fe, Ti, at least one of Si or Sn, and an additive material of at least one of Nb, V, Mo, W, or Zr,
wherein an amount of the additive material is smaller than an amount of Ti in the full Heusler alloy forming the n-type thermoelectric conversion unit,
wherein the full Heusler alloy forming the P-type thermoelectric conversion unit is different from the full Heusler alloy forming the N-type thermoelectric conversion unit,
wherein a ratio of a cross-section area of the P-type thermoelectric conversion unit on a plane orthogonal to a normal direction of the substrate to a sum total of the cross-section area of the P-type thermoelectric conversion unit on the plane and a cross-section area of the N-type thermoelectric conversion unit on the plane is in a range from 0.42 to less than 0.5,
wherein the cross-section area of the N-type thermoelectric conversion unit is larger than the cross-section area of the P-type thermoelectric conversion unit, and
wherein a length of the P-type thermoelectric conversion unit in the normal direction of the substrate and a length of the N-type thermoelectric conversion unit in the normal direction are in a range from 0.5 mm to 14.5 mm.

7. The thermoelectric conversion module according to claim 6,
wherein a ratio of the length of the P-type thermoelectric conversion unit in the normal direction of the substrate to a square root of the cross-section area of the N-type thermoelectric conversion unit on the plane or a ratio of the length of the N-type thermoelectric conversion unit in the normal direction to the square root of the cross-section area of the N-type thermoelectric conversion unit on the plane is in a range from 0.6 to 1.8.

8. A thermoelectric conversion module comprising:
a P-type thermoelectric conversion unit and an N-type thermoelectric conversion unit; and
a substrate on which the P-type thermoelectric conversion unit and the N-type thermoelectric conversion unit are mounted,
wherein a full Heusler alloy is used as a material for forming the P-type thermoelectric conversion unit and the N-type thermoelectric conversion unit,
wherein the full Heusler alloy forming the N-type thermoelectric conversion unit consists of Fe, Ti, at least one of Si or Sn, and an additive material of at least one of Nb, V, Mo, W, or Zr,
wherein an amount of the additive material is smaller than an amount of Ti in the full Heusler alloy forming the n-type thermoelectric conversion unit,
wherein a ratio of a length of the P-type thermoelectric conversion unit in a normal direction of the substrate to a square root of a cross-section area of the N-type thermoelectric conversion unit on a plane orthogonal to the normal direction or a ratio of a length of the N-type thermoelectric conversion unit in the normal direction to the square root of the cross-section area of the N-type thermoelectric conversion unit on the plane is in a range from 0.6 to 1.8,
wherein a cross-section area of the N-type thermoelectric conversion unit on the plane orthogonal to the normal direction is larger than the cross-section area of the P-type thermoelectric conversion unit, and
wherein the length of the P-type thermoelectric conversion unit in the normal direction of the substrate or the length of the N-type thermoelectric conversion unit in the normal direction is in a range from 0.5 mm to 14.5 mm.

* * * * *